United States Patent
Shin et al.

(10) Patent No.: US 6,179,955 B1
(45) Date of Patent: Jan. 30, 2001

(54) DRY ETCHING APPARATUS FOR MANUFACTURING SEMICONDUCTOR DEVICES

(75) Inventors: Eun-hee Shin, Seoul; Sung-bum Cho, Kyungki-do; Baik-soon Choi, Kyungki-do; Young-koo Lee, Kyungki-do, all of (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/317,138

(22) Filed: May 24, 1999

(30) Foreign Application Priority Data

Aug. 3, 1998 (KR) .................................. 98-31543

(51) Int. Cl.⁷ .............................. H01L 21/00; H05H 1/00
(52) U.S. Cl. ......................... 156/345; 118/723 I
(58) Field of Search ...................... 156/345; 118/723 I, 118/723 IR

(56) References Cited

U.S. PATENT DOCUMENTS 5,234,526 * 8/1993 Chen et al. .......................... 156/345
5,919,382 * 7/1999 Quian et al. ........................ 156/345

* cited by examiner

Primary Examiner—Thi Dang
(74) Attorney, Agent, or Firm—Jones Volentine, LLC

(57) ABSTRACT

A dielectric window of a dry etching apparatus for manufacturing semiconductor devices is shaped so that areas of high density plasma in the etching apparatus correspond to portions of the dielectric window further away from the wafer and areas of lower density plasma correspond to portions of the dielectric window closer to the wafer. For example, the dielectric window may be curve inwards at its center in a concave-shape.

8 Claims, 4 Drawing Sheets

DRY ETCHING APPARATUS FOR MANUFACTURING SEMICONDUCTOR DEVICES

BACKGROUND OF THE INVENTION

1. Field of the Invention

The present invention relates generally to a dry etching apparatus for manufacturing semiconductor devices, and more particularly, to a dry etching apparatus having an improved dielectric window.

2. Description of the Related Art

Generally, semiconductor devices are manufactured by forming multiple layers such as an insulating layer or a conductive layer on a semiconductor substrate and then patterning the layers. The patterns are formed by photolithography, which typically includes: depositing photoresist on the layers, forming a photoresist pattern by exposure and development, and etching the layers using the photoresist pattern as an etching mask. The etching step may be accomplished with either a wet etching using chemicals or a dry etching using plasma, although dry etching is generally preferred when forming high integration semiconductor devices.

Many devices have conventionally been used to improve the density distribution of plasma in the dry etching chamber. These include using an Electron Cyclotron Resonance (ECR) apparatus, an Inductivity Coupled Plasma (ICP) apparatus, or a Transformer Coupled Plasma (TCP) apparatus. In particular, a typical TCP apparatus is described in U.S. Pat. No. 5,731,565 to Gates. As described by Gates, a Transformer Coupled Plasma (TCP) apparatus includes a process chamber in which the plasma etching process is carried out and a dielectric window covering the upper side of the process chamber and sealing the process chamber. A chuck that holds the wafer to be etched is placed on the lower side of the process chamber. A helical-shaped coil is positioned outside of the process chamber on the upper side of the dielectric window and generates fields that induce plasma to form inside the chamber.

FIGS. 1 and 2 illustrate a conventional dielectric window. Dielectric window 1 is planar shaped, is of a certain thickness, and is made of quartz. The dielectric window 1 protects the inductive coil of the TCP apparatus from plasma inside the process chamber.

One problem associated with dielectric window 1 is that by-products, such as polymers, created during the etching process tend to attach to the lower surface of the dielectric window 1, with a greater portion of the polymers attaching to the center of the dielectric window 1 than to the peripheral portions. This can be detrimental to the etching process, because if the by-products detach during etching, they may contaminate the wafer. This problem can be exacerbated if the plasma unintentionally etches the lower surface of dielectric window 1 and deforms its shape.

One attempt at solving the above discussed problem is described in U.S. Pat. No. 5,401,350 to Patrick et al. This patent describes an inductive coil having more winding turns of the coil in its periphery than in its center. However, by-products still tend to form in greater proportions near the center of the dielectric window than at the periphery.

The by-products form on dielectric window 1 due to unintentional sputtering of the by-products on to the lower surface of the dielectric window 1 by capacitive coupling caused by radio frequency power applied to the inductive coil. As the by-products accumulate on the dielectric window during repeated etching procedures, the likelihood of some of them detaching and contaminating the wafer increases. Moreover, if the dielectric window is unintentionally etched, debris from the etching may also become a source of contamination to the wafer.

In summary, conventional dielectric windows used in dry etching devices suffer several disadvantages, including the fact that by-products of the etching, such as polymers, may accumulate on the dielectric window and the dielectric window itself may be unintentionally etched. These problems are sources of process failures during etching and affect the life time of the dry etching apparatus.

SUMMARY OF THE INVENTION

It is an object of the present invention to provide a dry etching apparatus for minimizing attachment of by-products such as polymers to the lower surface of a dielectric window of the dry etching apparatus, thereby minimizing the generation of the particles and improving the reliability and the productivity of semiconductor devices.

Another object of the present invention is to provide a dry etching apparatus that minimizes etching of the dielectric window to thereby increase the life time of the dielectric window.

To achieve these and other advantages and in accordance with the purpose of the present invention as embodied and broadly described, a dry etching apparatus for manufacturing semiconductor devices comprises a process chamber in which a wafer is mounted and a plasma etching process is performed. A dielectric window is located on an upper surface of the process chamber to cover the process chamber. A lower surface of the dielectric window is shaped such that a first portion of the lower surface of the dielectric window is further from a horizontal surface of the wafer than a second portion of the lower surface of the dielectric window, the first and second portions being arranged so that the first portion faces higher density plasma in the process chamber than the second portion. Finally, a coil is located adjacent to the upper side of the dielectric window and connected to a power source.

A second aspect of the present invention is directed to a dielectric window for use in a dry etching apparatus, the dielectric window comprising an upper surface and a lower surface. The lower surface is shaped such that a first portion of the lower surface of the dielectric window is spaced further from a horizontal plane below the dielectric window than a second portion of the lower surface of the dielectric window, the first and second portions being arranged so that the first portion will face higher density plasma when placed in a process chamber of the dry etching apparatus than the second portion.

It is to be understood that both the foregoing general description and the following detailed description are exemplary and explanatory and are intended to provide further explanation of the invention as claimed.

BRIEF DESCRIPTION OF THE DRAWINGS

A more complete appreciation of this invention will be readily apparent as the same becomes better understood by reference to the following detailed description when considered in conjunction with the accompanying drawings, in which like reference symbols indicate the same or similar components, wherein.

DETAILED DESCRIPTION OF PREFERRED EMBODIMENTS

Preferred embodiments of the present invention will now be described in detail with reference to the accompanying drawings.

Figure 1:
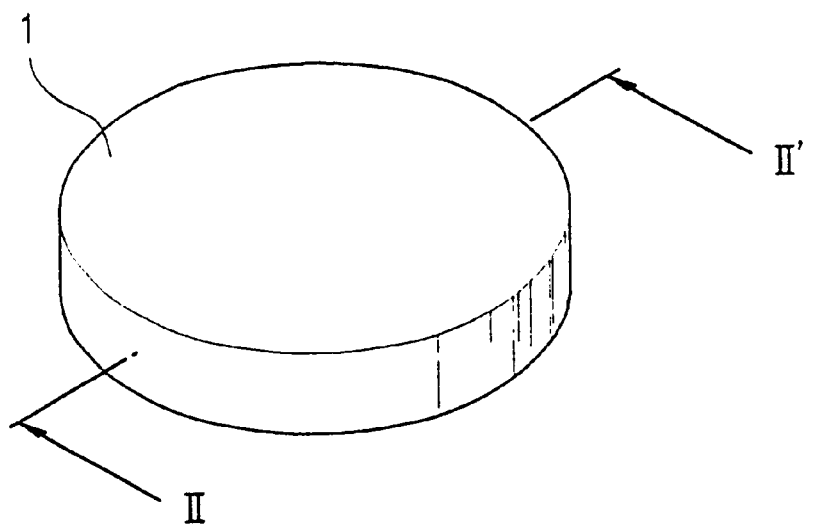
FIG. 1 is a perspective view of a dielectric window of a conventional dry etching apparatus for manufacturing semiconductor devices.
Figure 2:
FIG. 2 is a cross-sectional view of the dielectric window taken along the line 11-11' of FIG. 1.
Figure 3:
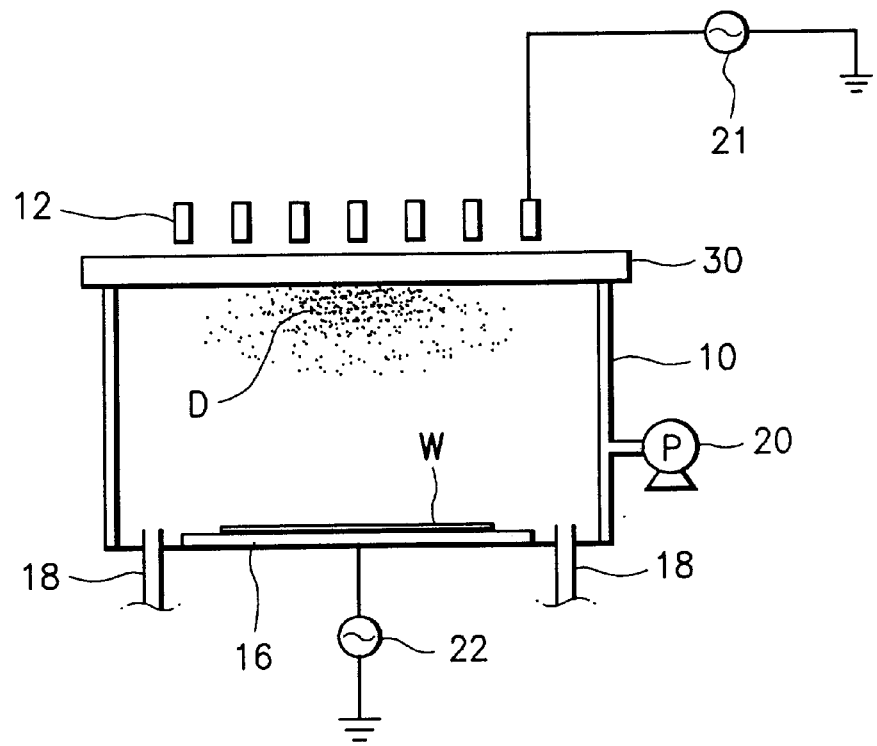
FIG. 3 schematically shows a dry etching apparatus for manufacturing semiconductor devices according to the present invention.

FIG. 3 is a diagram illustrating a dry etching apparatus for manufacturing semiconductor devices. As shown in FIG. 3, a chuck 16, such as an electrostatic chuck, is placed inside a process chamber 10. The chuck 16 serves as a biased electrode of the dry etching apparatus and mounts the semiconductor wafer W. Gas supply lines 18 supply process gas, which is used to generate the plasma, into the process chamber 10. Vacuum pump 20 forms a partial vacuum inside the process chamber 10. Additionally, a helical-shaped inductive coil 12 is located on the upper side outside the process chamber 10 and is connected to a radio frequency power generator 21.

Dielectric window 30 is placed between and separates the inductive coil 12 from the process chamber 10. The dielectric window 30 protects the inductive coil 12 from gas and plasma formed inside the process chamber 10.

In operation, gas is supplied into the process chamber 10 by gas supply lines 18 to maintain a predetermined level of pressure within the process chamber. Inductive coil 12 receives radio frequency power from generator 21 and thereby generates an inductive magnetic field following Fleming's Law. The inductive magnetic field, which is variable with respect to time, induces a solenoidal electric field. The generated inductive magnetic field and the generated electric field are directed downward, through dielectric window 30, and into process chamber 10.

Free electrons, which exist in the discharge region (D) of the process chamber 10 below the dielectric window 30, are accelerated by the inductive magnetic field and the electric field and collide with the process gas inside the process chamber 10, ionizing the process gas and thereby generating high density plasma. Further, a bias power supplied from power source 22 is applied to chuck 16, accelerating the ions that then etch wafer W.

Consistent with the present invention, the shape of dielectric window 30 is modified from the conventional planar shaped dielectric window 1. A number of different shapes are possible, some of which are shown in FIGS. 4–8. In general, dielectric window 30 is shaped in view of the plasma density distribution in chamber 10 so that the distance between the lower surface of the dielectric window 30 and the horizontal surface of the chuck 16 is varied with respect to the varying plasma density. More specifically, the lower surface portions of the dielectric window 30, which are proximate to relatively high plasma density inside the process chamber 10, are spaced farther from the horizontal surface of chuck 16 than portions of the dielectric window 30 which are proximate to lower density plasma.

More specific configurations of dielectric window 30 will now be described with reference to FIGS. 4–8.

First Embodiment

Figure 4:
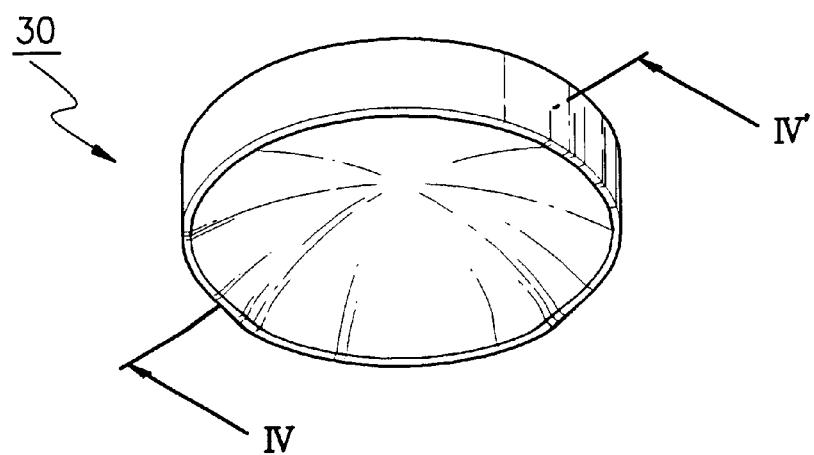
FIG. 4 is a perspective view of the dielectric window according to a first embodiment of the present invention.
Figure 5:
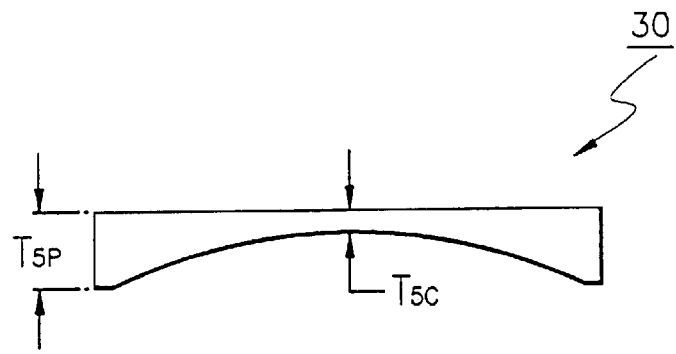
FIG. 5 is a cross-sectional view of the dielectric window taken along the line IV-IV' of FIG. 4.

Referring to FIGS. 4 and 5, the dielectric window 30 is configured such that its upper surface is flat and its lower surface is of a streamline-shaped. Preferably, the lower surface of the dielectric window 30 is concave shaped, i.e., curving further inwards at its center than at its peripheral portion. Thus, the thickness of the dielectric window 30 varies with respect to the density of plasma existing inside the process chamber 10.

The absolute physical dimensions of dielectric window 30 will vary depending on the dimensions of the process chamber 30. However, assuming that a conventional dielectric window has a thickness of approximately 20 mm, then, the dielectric window 30 consistent with the first embodiment preferably has a peripheral thickness ($T_{5p}$) between 18 mm and 22 mm and a center thickness ($T_{5c}$) between 14 mm and 16 mm.

Second Embodiment

Figure 6:
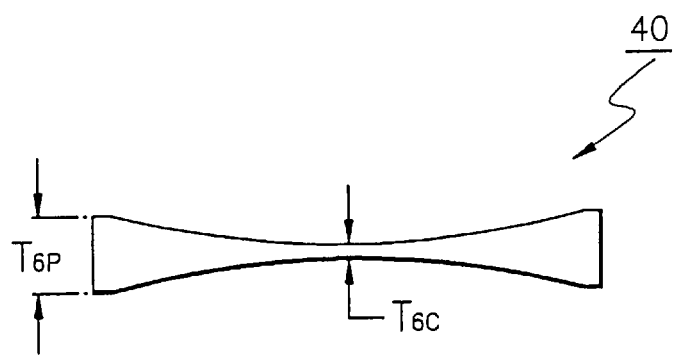
FIG. 6 is a cross-sectional view of the dielectric window according to a second embodiment of the present invention.

FIG. 6 is a diagram of a dielectric window formed according to a second embodiment of the present invention. Dielectric window 40 is constructed so that the upper surface and the lower surface of the dielectric window 40 are concave shaped, i.e., curved inward from the periphery to its center.

With dielectric window 40, either side may be positioned facing the chuck. Accordingly, when one side of the dielectric window 40 has reached its maximum useful life in the process chamber, the dielectric window 40 can simply be turned over. Therefore, the useful life of the dielectric window 40 can be lengthened.

In this embodiment, the thickness of the peripheral portion ($T_{6p}$) of the dielectric window 40 may be between 18 mm and 22 mm and the thickness of its center portion ($T_{6C}$) may be between 9 mm and 11 mm.

Third Embodiment

Figure 7:
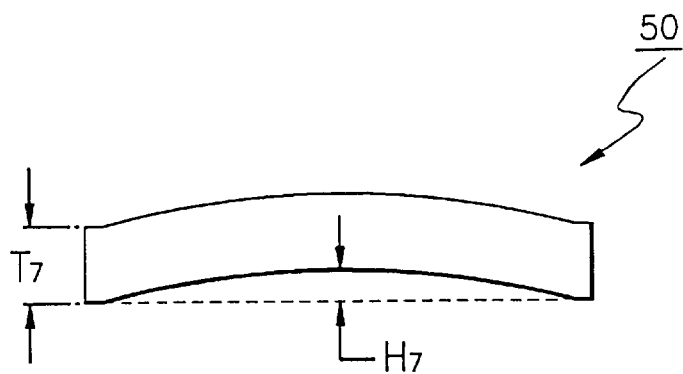
FIG. 7 is a cross-sectional view of the dielectric window according to a third embodiment of the present invention.

FIG. 7 is a diagram of a dielectric window formed according to a third embodiment of the present invention. Dielectric window 50 is dome shaped and has a uniform thickness $T_7$. Its center is spaced farther from the horizontal surface of chuck 16 than its other surface portions. Therefore, the center of the lower surface of dielectric window 50, which faces a higher plasma density than its peripheral portion, is spaced farther from the horizontal surface of the chuck 16 than the peripheral portion.

In this embodiment, the thickness of the dome-shaped dielectric window 50 ($T_7$) is between 18 mm and 22 mm and the height ($H_7$), between a horizontal plane extending through the peripheral bottom edges of the dielectric window 50 and the center of the lower surface of the dielectric window 50, is between 4 mm and 6 mm. If, for example, the distance from the lower surface of the dielectric window 50 and the wafer is 790 mm, then the distance from the wafer to the center of the lower surface of dielectric window 50 is between 794 mm and 796 mm.

Fourth Embodiment

Figure 8:
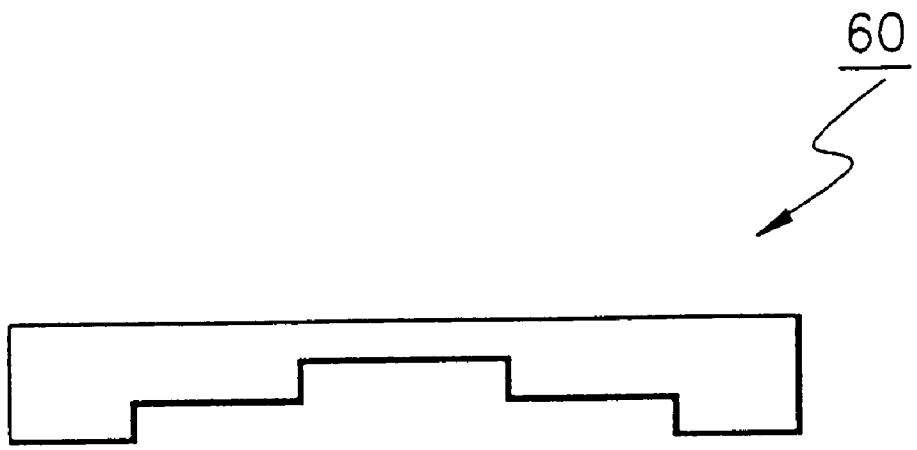
FIG. 8 is a cross-sectional view of the dielectric window according to a fourth embodiment of the present invention.

FIG. 8 is a diagram of a dielectric window formed according to a fourth embodiment of the present invention.

As shown, the lower surface of the dielectric window 60 is step shaped, in which the center of dielectric window 60 is spaced farther from the horizontal surface of chuck 16 than the other surface portions.

As described above, a dielectric window consistent with the present invention is a modification of the conventional planar type dielectric window. In particular, although dielectric windows 30, 40, 50, and 60 are similar to conventional dielectric windows, such as dielectric window 1, in that they have a thickness of approximately 20 mm, and are thus potentially compatible with conventional TCP apparatuses, dielectric windows 30, 40, 50, and 60 are of various shapes different from the conventional dielectric window. In particular, the center of the surface of the dielectric windows 30, 40, 50, and 60, which face a higher density of plasma, is spaced further from the wafer W than the other portions of the surface, which face lower density plasma. As a result, the plasma is not concentrated at the center of the dielectric windows 30, 40, 50, and 60 and the attachment of by-products such as polymers may be minimized. Thus, process failures caused by the by-products contaminating the wafer from the dielectric window are reduced. Moreover, etching of the dielectric window 30, 40, 50, and 60 is reduced so that the life time of the dielectric window can be lengthened.

While the present invention has been described in detail, it should be understood that various changes, substitutions and alterations can be made hereto without departing from the spirit and scope of the invention as defined by the appended claims.

What is claimed is:

1. A dry etching apparatus for manufacturing semiconductor devices comprising:
    a process chamber in which a wafer is mounted on a chuck and a plasma etching process is performed;
    a dielectric window located on an upper surface of the process chamber to cover the process chamber, a lower surface of the dielectric window shaped such that a first portion of the lower surface of the dielectric window is spaced further from a horizontal surface of the chuck than a second portion of the lower surface of the dielectric window, the first and second portions being arranged so that the first portion faces higher density plasma in the process chamber than the second portion, wherein an upper surface and the lower surface of the dielectric window are curved inwards at the center of the respective upper and lower surfaces and have a concave shape; and
    a coil located adjacent to the upper side of the dielectric window and connected to a power source.

2. The dry etching apparatus of claim 1, wherein a thickness of a peripheral portion of the dielectric window is between 18 mm and 22 mm and a thickness of the center portion of the dielectric window is between 9 mm and 11 mm.

3. A dry etching apparatus for manufacturing semiconductor devices comprising:
    a process chamber in which a wafer is mounted on a chuck and a plasma etching process is performed;
    a dielectric window located on an upper surface of the process chamber to cover the process chamber, a lower surface of the dielectric window shaped such that a first portion of the lower surface of the dielectric window is spaced further from a horizontal surface of the chuck than a second portion of the lower surface of the dielectric window, the first and second portions being arranged so that the first portion faces higher density plasma in the process chamber than the second portion; and
    a coil located adjacent to the upper side of the dielectric window and connected to a power source;
    wherein the upper surface of the dielectric window is flat, and the lower surface of the dielectric window is curved inwards at a center of the lower surface and has a concave shape.

4. The dry etching apparatus of claim 3, wherein a thickness of a peripheral portion of the dielectric window is between 18 mm and 22 mm and a thickness of the center portion of the dielectric window is between 14 mm and 16 mm.

5. A dielectric window for use in a dry etching apparatus, the dielectric window comprising:
    an upper surface, and
    a lower surface shaped such that a first portion of the lower surface of the dielectric window is spaced further from a horizontal plane below the dielectric window than a second portion of the lower surface of the dielectric window, the first and second portions being arranged so that the first portion will face higher density plasma when placed in a process chamber of the dry etching apparatus than the second portion, wherein the upper surface and the lower surface of the dielectric window are curved inwards at the center of the respective upper and lower surfaces and have a concave shape.

6. The dielectric window of claim 5, wherein a thickness of a peripheral portion of the dielectric window is between 18 mm and 22 mm and a thickness of the center portion of the dielectric window is between 9 mm and 11 mm.

7. A dry etching apparatus for manufacturing semiconductor devices comprising:
    a process chamber in which a wafer is mounted on a chuck and plasma etching process is performed;
    a dielectric window located on an upper surface of the process chamber to cover the process chamber, a lower surface of the dielectric window shaped such that a first portion of the lower surface of the dielectric window is spaced further from a horizontal surface of the chuck than a second portion of the lower surface of the dielectric window, the first and second portions being arranged so that the first portion faces higher density plasma in the process chamber than the second portion, wherein the lower surface of the dielectric window is step shaped and a center of the dielectric window is spaced further from the chuck than other portions of the lower surface of the dielectric window; and
    a coil located adjacent to the upper side of the dielectric window and connected to a power source.

8. A dielectric window for use in a dry etching apparatus, the dielectric window comprising:
    an upper surface, and
    a lower surface shaped such that a first portion of the lower surface of the dielectric window is spaced further from a horizontal plane below the dielectric window than a second portion of the lower surface of the dielectric window, the first and second portions being arranged so that the first portion will face higher density plasma when placed in a process chamber of the dry etching apparatus than the second portion, wherein the lower surface of the dielectric window is step shaped and a center of the dielectric window is spaced further from the horizontal plane than other portions of the lower surface of the dielectric window.

* * * * *